United States Patent
Peng et al.

(10) Patent No.: US 6,478,659 B2
(45) Date of Patent: Nov. 12, 2002

(54) CHEMICAL MECHANICAL POLISHING METHOD FOR SLURRY FREE FIXED ABRASIVE PADS

(75) Inventors: Cheng-An Peng, Ping-Tung (TW); Jiun-Fang Wang, Hsin-chu (TW)

(73) Assignee: Promos Technologies, Inc., Hsinchu (TW)

(*) Notice: Subject to any disclaimer, the term of this patent is extended or adjusted under 35 U.S.C. 154(b) by 22 days.

(21) Appl. No.: 09/737,123

(22) Filed: Dec. 13, 2000

(65) Prior Publication Data

US 2002/0072238 A1 Jun. 13, 2002

(51) Int. Cl.$^7$ ............... B24B 1/00; B24B 49/00; B24B 51/00
(52) U.S. Cl. ............... 451/8; 451/36; 451/41; 451/58
(58) Field of Search ............... 451/8, 36, 37, 451/41, 57, 58, 63; 216/88, 89; 438/692, 693

(56) References Cited

U.S. PATENT DOCUMENTS

| | | | | |
|---|---|---|---|---|
| 5,643,406 A | * | 7/1997 | Shimomura et al. | 451/41 |
| 5,897,426 A | * | 4/1999 | Somekh | 451/41 |
| 5,934,980 A | * | 8/1999 | Koos et al. | 451/41 |
| 6,135,855 A | * | 10/2000 | Vanell | 451/288 |
| 6,136,043 A | * | 10/2000 | Robinson et al. | 451/8 |
| 6,203,404 B1 | * | 3/2001 | Joslyn et al. | 451/41 |
| 6,261,158 B1 | * | 7/2001 | Holland et al. | 451/63 |
| 6,326,299 B1 | * | 12/2001 | Homma et al. | 438/692 |
| 6,358,850 B1 | * | 3/2002 | Economikos et al. | 438/692 |
| 6,361,415 B1 | * | 3/2002 | Sethuraman et al. | 451/36 |

* cited by examiner

Primary Examiner—Timothy V. Eley
(74) Attorney, Agent, or Firm—Blakely Sokoloff Taylor & Zafman LLP

(57) ABSTRACT

A fixed abrasive chemical polishing method uses an aqueous solution that has a variable pH. During polishing the pH of the aqueous solution is changed so that the polishing process can be more precisely controlled. The removal rate and removal selectivity between oxide and nitride can be controlled by varying the pH of the aqueous solution.

7 Claims, 5 Drawing Sheets

```
┌─────────────────┐
│  BULK POLISH AT │
│    HIGH pH      │  301
└─────────────────┘
         │
         ▼
┌─────────────────┐
│  FINE POLISH AT │
│   LOWERED pH    │  303
└─────────────────┘
```

FIGURE 3

CHEMICAL MECHANICAL POLISHING METHOD FOR SLURRY FREE FIXED ABRASIVE PADS

FIELD OF THE INVENTION

The present invention relates to chemical mechanical polishing (CMP), and more particularly, to pH control during a slurry free CMP process.

BACKGROUND OF THE INVENTION

Chemical mechanical polishing (CMP) has emerged as a crucial semiconductor technology, particularly for devices with critical dimensions smaller than 0.3 microns. CMP machines typically include a means of holding a wafer or substrate to be polished (also referred to as a "wafer chuck"), a polishing pad, and a means to support the pad (also referred to as a "platen"). In many conventional CMP machines, an abrasive slurry is required for polishing and is delivered either directly to the surface of the pad or through holes and grooves in the pad directly to the surface of the wafer. The polishing pad is not typically abrasive. The control system on the CMP machine causes motors to press the surface of the wafer against the pad surface with a prescribed amount of force.

One of the recent developments in CMP technology is slurry free fixed abrasive pad polishing. In this method, an abrasive slurry is not used. Instead, the abrasive material is fixed and integrated into the polishing pad. An example of such a system is described in U.S. Pat. No. 6,069,080 to James et al. The advantage of this type of system is that large amounts of abrasive slurry are not needed, thereby also eliminating the need for time consuming cleaning steps. Although an abrasive slurry is not used, an aqueous fluid is used to facilitate the polishing action. In the '080 patent, the aqueous fluid is maintained at a constant pH.

Another concern in the CMP process is the accurate detection of the endpoint of the CMP process. In many important applications, the CMP process is used to remove an oxide layer until an underlying stop layer is reached, such as a nitride. For example, the use of a nitride as a stop layer underneath an oxide layer is commonly used in the formation of shallow trench isolation structures. However, it is still relatively difficult to accurately detect when the nitride stop layer has been reached.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 3 is a flow diagram illustrating the method of the present invention.

DETAILED DESCRIPTION OF THE PREFERRED EMBODIMENT

Figure 1:
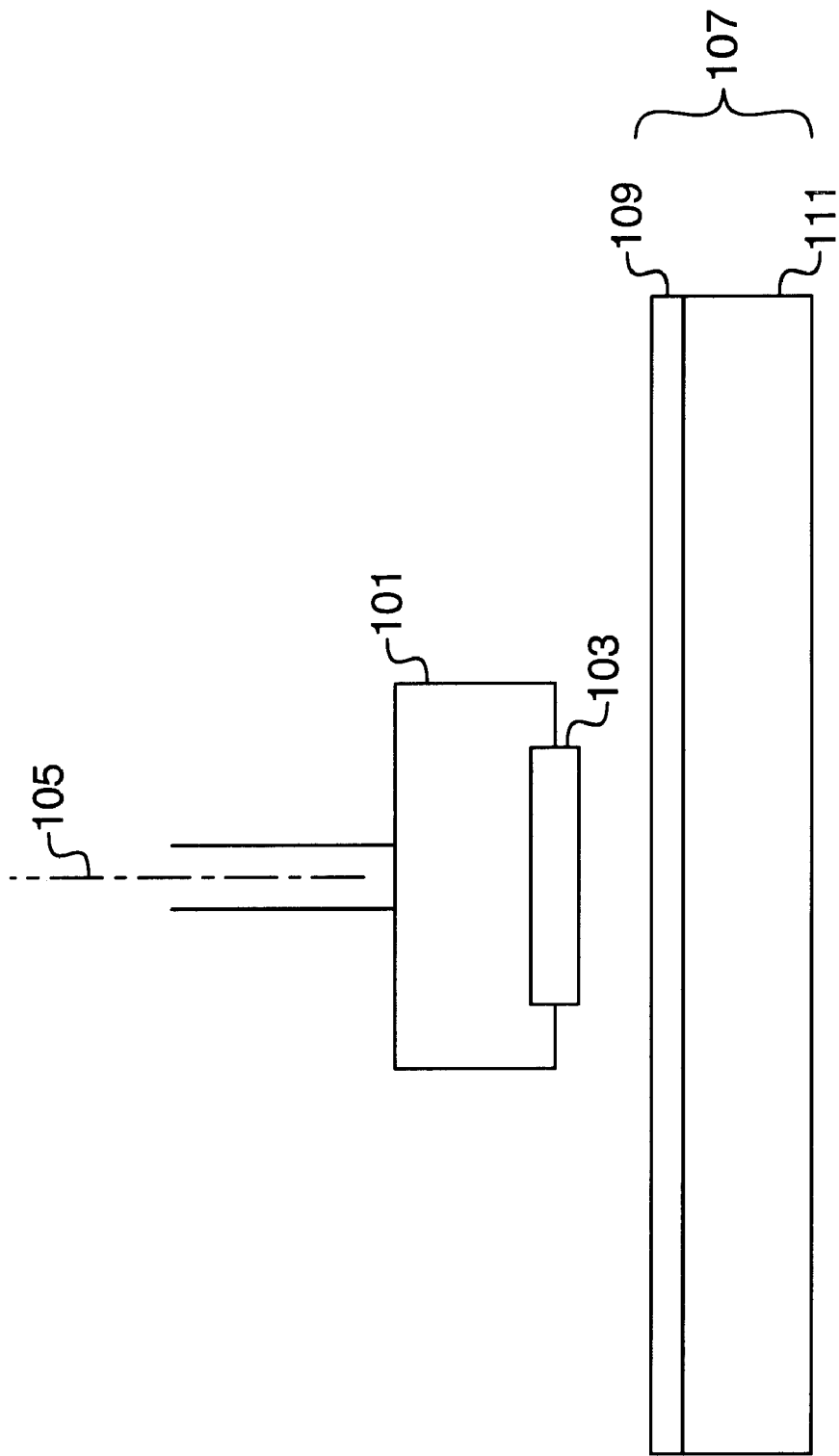
FIG. 1 is a schematic illustration of a CMP apparatus formed in accordance with the present invention.

A schematic representation of the overall system of the present invention is shown in FIG. 1. As seen, a wafer chuck 101 holds a wafer 103 that is to be polished. The wafer chuck 101 preferably rotates about its vertical axis 105. A pad assembly 107 includes a polishing pad 109 mounted onto a polishing table 111. The polishing table is secured to a driver or motor means (not shown) that is operative to move the pad assembly 107 is the desired manner.

In accordance with the present invention, it has been found that by varying the pH of the non-abrasive aqueous solution during polishing, the removal selectivity between oxide and nitride can be adjusted. Note that there are other prior art slurry using methods to increase the removal selectivity between oxide and nitride. However, in these prior art methods, once the removal selectivity has been determined, the removal selectivity cannot be changed during the CMP process. By simply choosing a high selectivity, this results in several detrimental effects, such as oxide residue if there are high topographical features. Also, increased oxide dishing may occur in certain applications, such as during the formation of shallow trench isolation. Thus, as will be detailed below, the present invention teaches that the pH of the aqueous solution is changed dynamically as the endpoint of the CMP process nears in a slurry free fixed abrasive CMP process.

Figure 2:
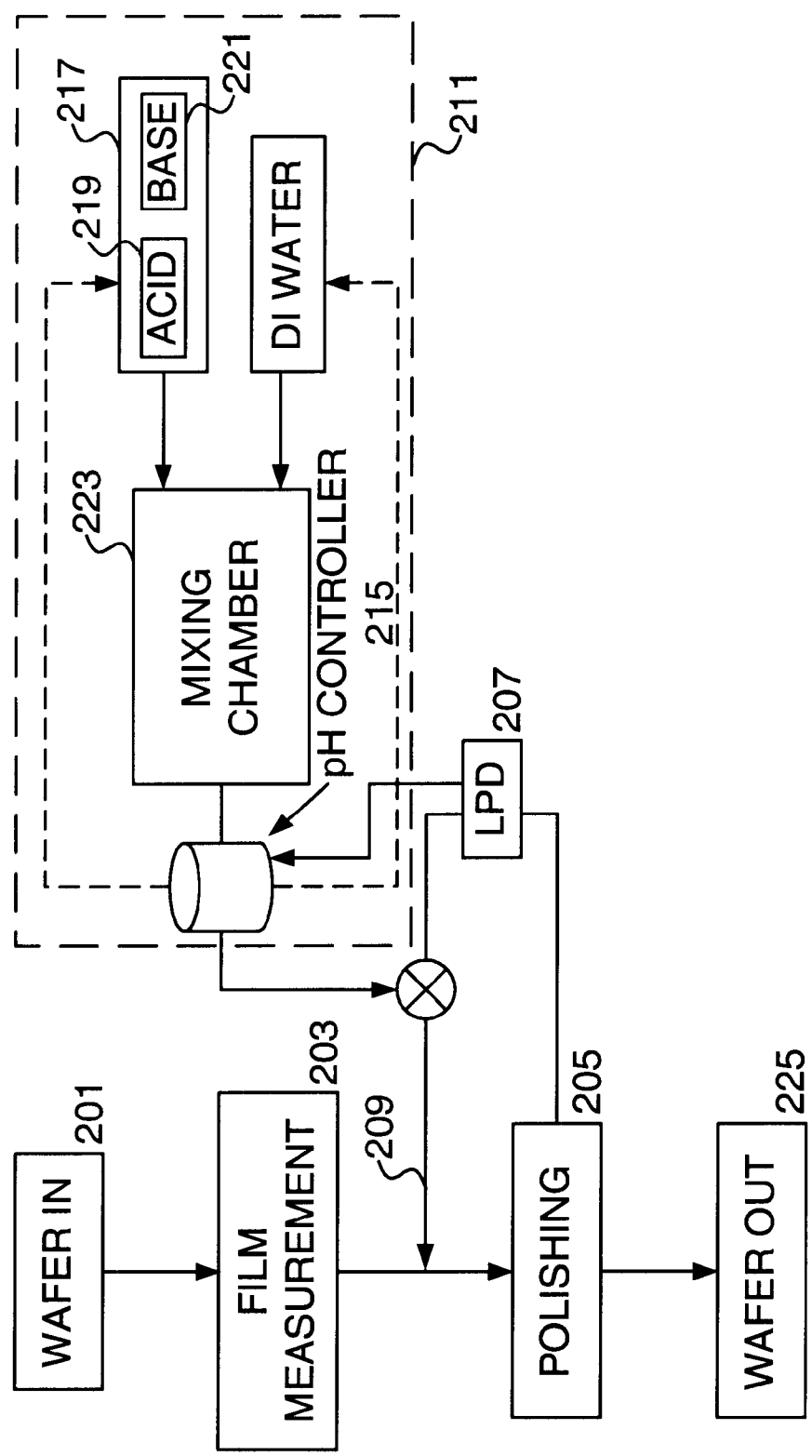
FIG. 2 is a schematic flow chart of the one embodiment of the present invention.

FIG. 2 shows a schematic flow diagram on the method of the present invention. First, at box 201, the wafer that is to be polished is presented. The wafer may have an oxide layer that requires planarization or removal. Next, at box 203, a film measurement process is carried out. This film measurement process measures the thickness of the oxide layer so that a rough guess of how much polishing is needed. Next, at step 205, the wafer is loaded into the polishing machine for polishing. The wafer is held in place by the wafer chuck 101. The polishing apparatus 109 includes a polishing pad 109. Preferably, the polishing pad 109 is a fixed abrasive polishing pad, such as that described in U.S. Pat. No. 6,069,080, although other commercially available fixed abrasive pads may be used. The above steps are conventional in the art.

After the wafer is loaded, the polishing process begins. The polishing machine includes a delivery system for delivering an aqueous solution to the polishing pad and wafer surface. The aqueous solution lubricates and otherwise facilitates the polishing process. In one embodiment, the aqueous solution is a solution of deionized water and various other chemicals that control the pH of the deionized water. Furthermore, other chemicals may be included in the aqueous solution that facilitates the polishing of the wafer. A pipe 209 delivers the aqueous solution to the wafer and polishing pad. Additionally, the polishing machine includes an endpoint detection (EDP) system 207 that can detect when the polishing process should terminate.

Still referring to FIG. 2, a pH modification system 211 closely controls the pH of the aqueous solution. The pH modification system 211 includes a deionized water reservoir 213, a pH controller 215, an acid/base reservoir 217, and a pH mixing chamber 223. The acid/base reservoir 217 includes an acid source 219 and a base source 221.

In operation, the pH modification system 211 can change the pH of the aqueous solution by adding either an acid from the acid source 219 or a base from the base source 221. The pH controller 215 monitors the pH of the aqueous solution from the pH mixing chamber 223. Depending upon the polishing process required, the pH controller 215 selectively modifies the pH level of the aqueous solution. Various acids or bases (stored in the acid/base reservoir 217) can be added to modify the pH of the aqueous solution. KOH, NH$_4$OH, CsOH, TMAH, or amines may be added singularly or in combination to change the pH of the aqueous solution. To lower the pH of the aqueous solution, deionized water may be used to dilute the solution or an acid added to the solution.

Turning to FIG. 3, in one embodiment where oxide is to be removed over a nitride stop layer, during the initial polishing at box 301, the pH of the aqueous solution is maintained to be relatively high, e.g., greater than 11. In one embodiment, the pH is on the order of 11.5 or higher. It has been found that a relatively high pH provides an excellent rate of removal of the oxide, increasing throughput. It has also been found that there is a linear relationship between pH and removal rate. However, the high pH also results in a relatively low removal selectivity between oxide and nitride, on the order of 1:1.

Therefore, in accordance with the present invention, at box 303, after the bulk of the oxide layer has been removed, the pH of the aqueous solution is changed to a lower level. This lowers the removal rate of the oxide and also increases the removal selectivity between oxide and nitride. This in turn results in greater process control.

In one embodiment, the transition from a high pH to a low pH is governed by a signal from the EPD system 207. The EPD system 207 is conventional to most polishing machines and is operative to determine when an endpoint is reached during the polishing process. For example, the EPD system 207 may operate in a time mode. In the above example, when the EPD system 207 first detects that the underlying nitride layer may be reached, the EPD system 207 provides a signal to the pH controller 215 to lower the pH of the aqueous solution. At that point, further polishing for a limited time (e.g. 40 seconds) is performed using the lower pH aqueous solution.

Additionally, in one embodiment, during the bulk polishing at box 301, the rotational speed of the polishing pad relative to the wafer may be increased. During the fine polish at box 303, the relative rotational speed may be decreased to lower the number of polishing defects. Finally, after the fine polish is complete, at box 225, the wafer is removed from the polishing machine.

Figure 4:
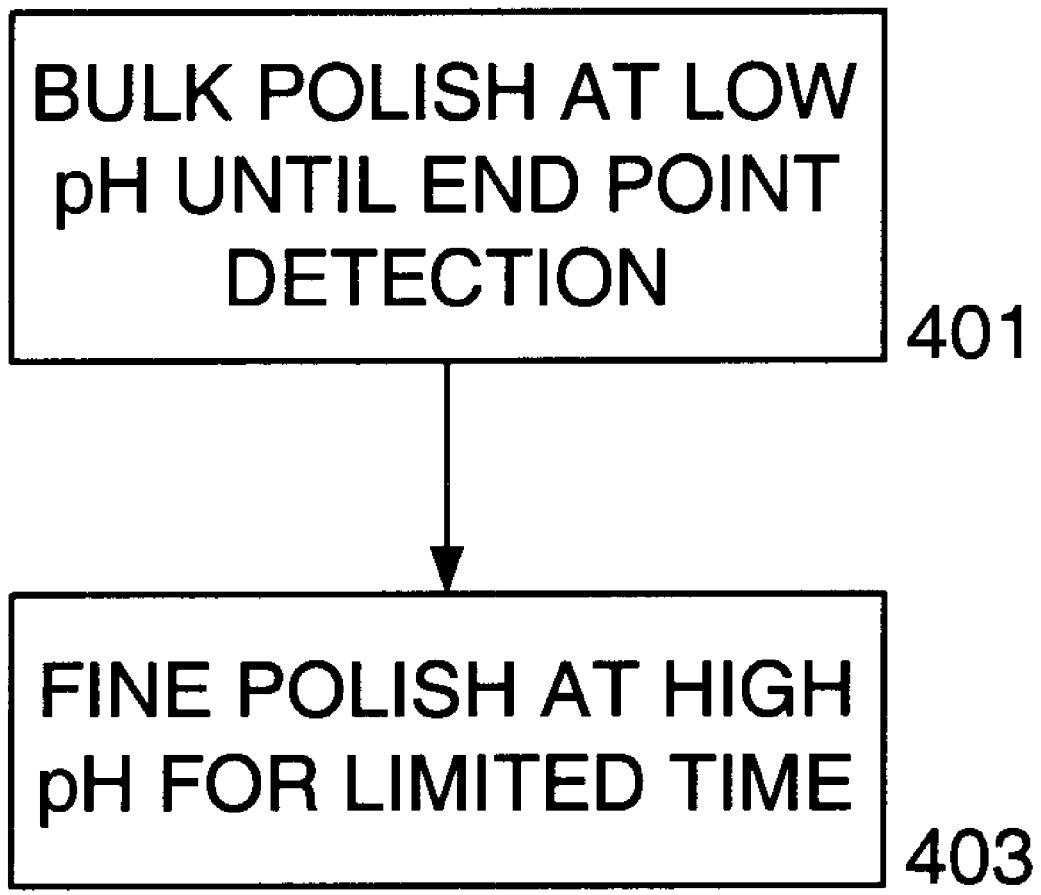
FIGS. 4 and 5 are flow diagrams illustrating alternative embodiments of the present invention.

In an alternative embodiment shown in FIG. 4, where oxide is to be removed over a nitride stop layer, during the initial polishing at box 401, the pH of the aqueous solution is maintained to be relatively low, e.g., lower than 10. The bulk polishing is continued until the EPD system 207 outputs a signal indicating that the nitride layer has been reached. Next, at box 403, after the bulk of the oxide layer has been removed, the pH of the aqueous solution is changed to a higher level, e.g. above 11.5, and a fine polish is performed for a limited time, such as 10 seconds. In this embodiment, the fine polish quickly removes any oxide residue and a portion of the nitride layer.

Figure 5:
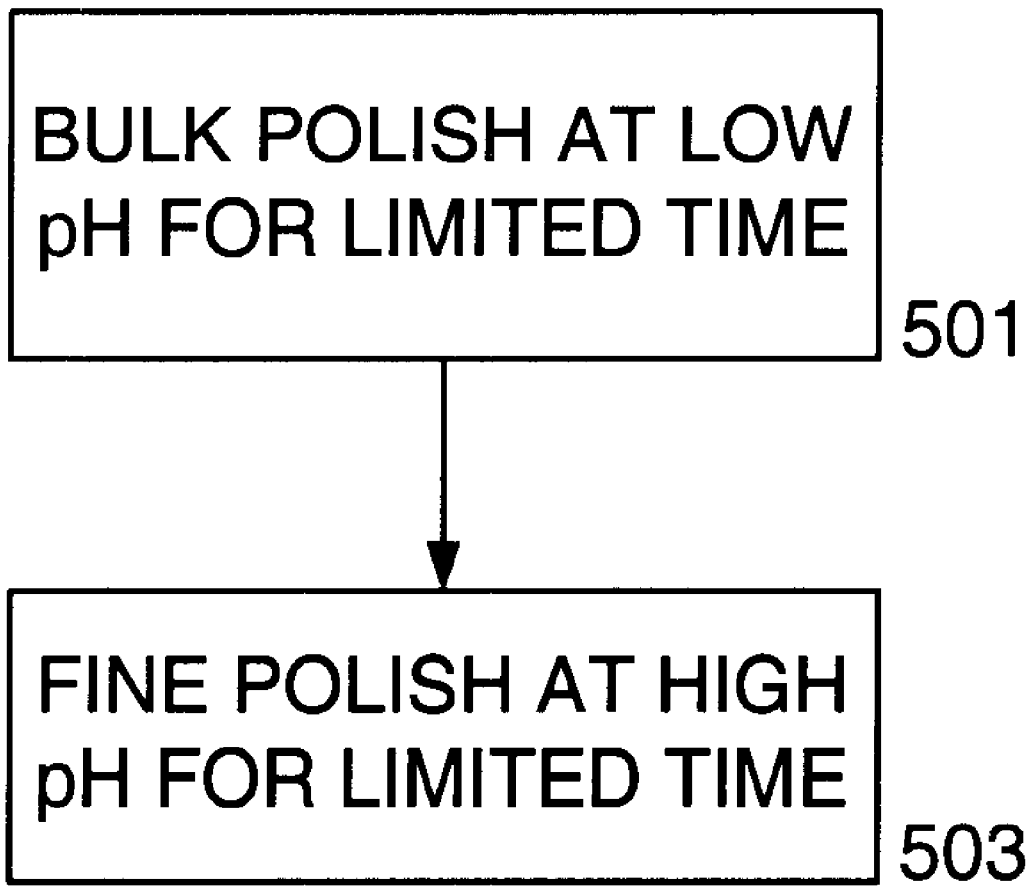

In another alternative embodiment shown in FIG. 5, where oxide is to be removed over a nitride stop layer, during the initial polishing at box 501, the pH of the aqueous solution is maintained to be relatively low, e.g., lower than 10. The bulk polishing for a predetermined amount of time (e.g. 100 seconds), without regard to the EPD system 207. Next, at box 503, after the bulk of the oxide layer has been removed, the pH of the aqueous solution is changed to a higher level, e.g. above 11.5, and a fine polish is performed for a limited time, such as 10 seconds. In this embodiment, the fine polish quickly removes any oxide residue and a portion of the nitride layer.

While the preferred embodiment of the invention has been illustrated and described, it will be appreciated that various changes can be made therein without departing from the spirit and scope of the invention.

What is claimed is:

1. A method for polishing a semiconductor wafer comprising:
    rotating said semiconductor wafer against a fixed abrasive polishing pad;
    applying an aqueous solution to said semiconductor wafer and said fixed abrasive polishing pad; and
    lowering the pH of said aqueous solution during the polishing process wherein the pH is lowered when an endpoint detection signal is received from an endpoint detection system.

2. The method of claim 1 wherein said pH is changed after a predetermined amount of time.

3. A method for polishing a semiconductor wafer comprising:
    implementing a relative rotational movement between said semiconductor wafer and a fixed abrasive polishing pad;
    applying for a first time period an aqueous solution having a first pH to said semiconductor wafer and said fixed abrasive polishing pad, the first time period to finish when an endpoint detection signal is generated by an endpoint detection system; and
    applying for a second time period an aqueous solution having a second pH to said semiconductor wafer and said fixed abrasive polishing pad, wherein said first pH is higher than said second pH.

4. The method of claim 3, wherein said first pH is higher than 11 and said second pH is lower than 11.

5. The method of claim 4, wherein said first pH is higher than 11.5.

6. The method of claim 3, wherein said second time period is about 40 seconds.

7. The method of claim 3 wherein said first time period is predetermined prior to initiation of the polishing.

* * * * *